(12) United States Patent
Varanasi

(10) Patent No.: US 8,762,630 B2
(45) Date of Patent: *Jun. 24, 2014

(54) APPARATUSES AND METHODS OF OPERATING FOR MEMORY ENDURANCE

(71) Applicant: Micron Technology, Inc., Boise, ID (US)

(72) Inventor: Chandra C. Varanasi, Broomfield, CO (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/948,830

(22) Filed: Jul. 23, 2013

(65) Prior Publication Data

US 2013/0311714 A1    Nov. 21, 2013

Related U.S. Application Data

(63) Continuation of application No. 13/222,942, filed on Aug. 31, 2011, now Pat. No. 8,495,285.

(51) Int. Cl.
   *G06F 12/00* (2006.01)
(52) U.S. Cl.
   USPC .................. 711/103; 365/185.03; 365/185.33
(58) Field of Classification Search
   USPC .......................... 711/103; 365/185.03, 185.33
   See application file for complete search history.

(56) References Cited

U.S. PATENT DOCUMENTS

| | | | |
|---|---|---|---|
| 6,794,997 B2 | 9/2004 | Sprouse | |
| 7,565,391 B2 | 7/2009 | Hu | |
| 7,573,969 B2 | 8/2009 | Shen et al. | |
| 7,644,225 B2 * | 1/2010 | Dover | 711/103 |
| 7,802,132 B2 | 9/2010 | Annavajjhala et al. | |
| 8,301,828 B2 * | 10/2012 | Miller | 711/103 |
| 2008/0130364 A1 * | 6/2008 | Guterman et al. | 365/185.09 |
| 2010/0082884 A1 | 4/2010 | Chen et al. | |
| 2010/0238730 A1 | 9/2010 | Dutta et al. | |
| 2011/0051507 A1 | 3/2011 | Sarkar et al. | |
| 2011/0051522 A1 | 3/2011 | Luo | |
| 2011/0188312 A1 | 8/2011 | Goda et al. | |

FOREIGN PATENT DOCUMENTS

WO    2010092536 A1    8/2010

OTHER PUBLICATIONS

International Search Report and Written opinion for related PCT Application No. PCT/US2012/053107, mailed Dec. 28, 2012 (9 pgs.).

* cited by examiner

*Primary Examiner* — Hashem Farrokh
(74) *Attorney, Agent, or Firm* — Brooks, Cameron & Huebsch, PLLC

(57) ABSTRACT

Methods of operating an apparatus such as a computing system and/or memory device for memory endurance are provided. One example method can include receiving m digits of data having a first quantity of digits represented by a first data state that is more detrimental to memory cell wear than a second data state. The m digits of data are encoded into n digits of data having a second quantity of digits represented by the first data state. The value n is greater than the value m. The second quantity is less than or equal to the first quantity. The n digits of data are stored in an apparatus having memory cells.

20 Claims, 5 Drawing Sheets

| R | m = 3 |
|---|---|
| 0 | 0 0 0 |
| 1 | 0 0 1 |
| 2 | 0 1 0 |
| 3 | 0 1 1 |
| 4 | 1 0 0 |
| 5 | 1 0 1 |
| 6 | 1 1 0 |
| 7 | 1 1 1 |

| n = 4 | #0s ≥ #1s | X |
|---|---|---|
| 0 0 0 0 | Y | 0 |
| 0 0 0 1 | Y | 1 |
| 0 0 1 0 | Y | 2 |
| 0 0 1 1 | Y | 3 |
| 0 1 0 0 | Y | 4 |
| 0 1 0 1 | Y | 5 |
| 0 1 1 0 | Y | 6 |
| 0 1 1 1 | N | 7 |
| 1 0 0 0 | Y | 8 |
| 1 0 0 1 | Y | 9 |
| 1 0 1 0 | Y | 10 |
| 1 0 1 1 | N | 11 |
| 1 1 0 0 | Y | 12 |
| 1 1 0 1 | N | 13 |
| 1 1 1 0 | N | 14 |
| 1 1 1 1 | N | 15 |

*Fig. 4*

APPARATUSES AND METHODS OF OPERATING FOR MEMORY ENDURANCE

PRIORITY APPLICATION INFORMATION

This application is a Continuation of U.S. application Ser. No. 13/222,942, filed Aug. 31, 2011, to be issued as U.S. Pat. No. 8,495,285 on Jul. 23, 2013, the specification of which is incorporated herein by reference.

TECHNICAL FIELD

The present disclosure relates generally to semiconductor memory devices and methods, and more particularly, to methods of operating for memory endurance.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), resistive memory (e.g., RRAM), and Flash memory, among others.

Memory devices are utilized as volatile and non-volatile data storage for a wide range of electronic applications. Flash memory, which is just one type of memory, typically uses a one-transistor memory cell that allows for high memory densities, high reliability, and low power consumption. Non-volatile memory may be used in, for example, personal computers, portable memory sticks, solid state drives (SSDs), digital cameras, cellular telephones, portable music players such as MP3 players, movie players, and other electronic devices. Memory cells can be arranged into arrays, with the arrays being used in memory devices.

A memory cell of a memory device can be programmed to a desired data state. For example, a single level cell (SLC) can be programmed to one of two data states, such as a logic high or binary "1" data state and a logic low or binary "0" data state. Multilevel cells (MLCs) can be programmed to one of more than two data states. For example, some Flash MLC memory cells can be programmed to one of four, eight, or sixteen data states (e.g., 1111, 0111, 0011, 1011, 1001, 0001, 0101, 1101, 1100, 0100, 0000, 1000, 1010, 0010, 0110, and 1110), where each of these data states is represented by a respective quantity of electric charge placed on or removed from a charge storage structure (e.g., a floating gate). A memory cell can have one or more nodes as part of the structure. As such, MLCs can allow the manufacture of higher density memories without increasing the number of memory cells since each cell can be programmed to one of two data states, and thus, store more than one bit. For these MLCs, the lowermost data state is typically not programmed above the erased state, that is, if the cell is programmed to the lowermost data state, it remains in the erased state rather than, for example, having a charge stored in the cell during a programming operation. The other fifteen data states can be referred to as "non-erased" states.

Some memory cells have wear relative to the quantity of program and erase cycles to which they are subjected. That is, memory cell performance can degrade with repeated use. The extent to which Flash MLCs degrade can also be relative to the amount of charge stored when programmed. That is, data states represented by the storage of relatively larger charge amounts tend to wear a memory cell relatively faster than those data states represented by the storage of relatively smaller charge amounts.

BRIEF DESCRIPTION OF THE DRAWINGS

FIG. 4 illustrates mapping 3 bits of data to a 4-bit index in accordance with one or more embodiments of the present disclosure.

DETAILED DESCRIPTION

Figure 1:
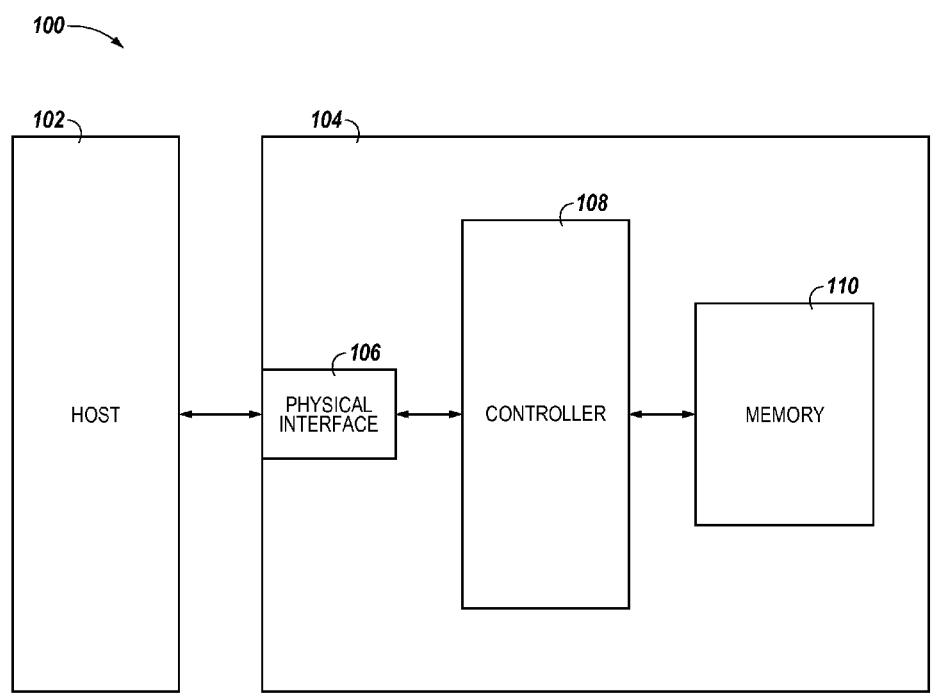
FIG. 1 is a functional block diagram of an apparatus in the form of a computing system including a memory in accordance with one or more embodiments of the present disclosure.

One example method can include receiving m digits of data having a first quantity of digits represented by a first data state that is more detrimental to memory cell wear than a second data state. The m digits of data are encoded into n digits of data having a second quantity of digits represented by the first data state. The value n is greater than the value m. The second quantity is less than or equal to the first quantity. The third quantity is greater than the second quantity. The n digits of data are stored in an apparatus having memory cells.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designator "N," particularly with respect to reference numerals in the drawings, indicates that one or more of the particular feature so designated can be included with one or more embodiments of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

A memory can experience increasingly degraded performance and/or failure after repeated program and/or erase cycles, often referred to as wear. A conventional approach to address wear of a memory is so-called wear leveling. Wear leveling may attempt to use memory cells more uniformly so as to avoid some portion of the memory cells wearing out faster than others, thereby increasing memory endurance by attempting to prevent spot failures due to isolated wear. Wear leveling techniques can include static and/or dynamic wear leveling techniques such as "garbage collection" techniques. Conventional wear leveling techniques are typically responsive to some measure of wear that has already occurred. For example, wear leveling techniques may be triggered based on program/erase cycle counts, or other wear metric. The apparatuses and methods according to at least some of the embodiments of the present disclosure approach memory wear in a different manner, such as by avoiding wear before it occurs.

FIG. 1 is a functional block diagram of an apparatus in the form of a computing system 100 including at least one memory device 104, in accordance with one or more embodiments of the present disclosure. In the embodiment illustrated in FIG. 1, the memory device 104, e.g., a solid state drive (SSD), thumb drive, etc., can include a physical host interface 106, a controller 108, e.g., processor, control circuitry, etc., and memory 110, e.g., arrangement of one or more memory cells. In one or more embodiments, the controller 108 can be an application specific integrated circuit (ASIC) coupled to a printed circuit board including the physical interface 106 and memory 110.

As illustrated in FIG. 1, the controller 108 can be coupled to the physical host interface 106 and to the memory 110. The physical host interface 106 can be used to communicate information between the memory device 104 and another device such as a host 102. Host 102 can include a memory access device, e.g., a processor, and/or other computing components. One of ordinary skill in the art will appreciate that "a processor" can intend one or more processors, such as a parallel processing system, one or more of coprocessors, etc. Examples of hosts include laptop computers, personal computers, digital cameras, digital recording and playback devices, mobile telephones, PDAs, memory card readers, interface hubs, and the like. As an example the memory device 104 can include, but is not limited to, a portable SSD. Methods of the present disclosure can be implemented by, for example, the controller 108 and/or the host 102.

For one or more embodiments, the physical host interface 106 can be in the form of a standardized interface. For example, when the memory device 104 is used for data storage in a computing system 100, the physical host interface 106 can be a serial advanced technology attachment (SATA), peripheral component interconnect express (PCIe), or a universal serial bus (USB), among other connectors and interfaces. In general, however, physical host interface 106 can provide an interface for passing control, address, data, and other signals between the memory device 104 and a host 102 having compatible receptors for the physical host interface 106.

The controller 108 can communicate with the memory 110 to read, write, and erase data, among other operations. Controller 108 can have circuitry that may be one or more integrated circuits and/or discrete components. For one or more embodiments, the circuitry in controller 108 may include control circuitry for controlling access across the memory 110 and circuitry for providing a translation layer between a host 102 and the memory device 104. Thus, a memory controller could selectively couple an I/O connection (not shown in FIG. 1) of a memory 110 to receive the appropriate signal at the appropriate I/O connection at the appropriate time. Similarly, the communication protocol between a host 102 and the memory device 104 may be different than what is required for access of a memory 110. Controller 108 could then translate the commands received from a host into the appropriate commands to achieve the desired access to a memory 110.

Memory 110 can be a non-transitory media, and include one or more arrays of memory cells, e.g., non-volatile memory cells. The arrays can be Flash arrays with a NAND architecture, for example. In a NAND architecture, the control gates of memory cells of a "row" can be coupled with an access, e.g., word, line, while the memory cells can be coupled in series source to drain in a "string" between a select gate source transistor and a select gate drain transistor. The string can be connected to a data, e.g., bit, line by the select gate drain transistor. The use of the terms "row" and "string" implies neither a linear nor an orthogonal arrangement of memory cells. As will be appreciated by those of ordinary skill in the art, the manner of connection of the memory cells to the bit lines and source lines depends on whether the array is a NAND architecture, a NOR architecture, or some other memory array architecture. The methods and apparatuses of the present disclosure can also be used or implemented with other memory cells, such as memory cells typically used in, for example, DRAM, PCRAM, and/or RRAM memories.

The memory 110 can include one or more of memory cells that can be grouped. As used herein, a group can include one or more memory cells, such as a page, block, plane, die, an entire array, or other groups of memory cells. For example, some memory arrays can include one or more of pages of memory cells that make up a block of memory cells. One or more of blocks can be included in a plane of memory cells. One or more of planes of memory cells can be included one a die. As an example, a 128 GB memory device can include 4314 bytes of data per page, 128 pages per block, 2048 blocks per plane, and 16 planes per device.

The memory 110 can include in one or more of channels, wherein each channel can include one or more of dies. Each channel can be organized using logical unit numbers (LUNs). When writing data to the memory 110, data can be disbursed across the number of channels and LUNs. In a memory device, a physical page can refer to a unit of writing and/or reading, e.g., one or more of cells that are written and/or read together or as a functional group of memory cells. An even page and an odd page can be written and/or read with separate writing and/or reading operations. For embodiments including multilevel cells (MLC), a physical page can be logically divided into an upper page and a lower page of data. For example, one memory cell can contribute one or more bits to an upper page of data and one or more bits to a lower page of data. Accordingly, an upper page and a lower page of data can be written and/or read as part of one writing and/or reading operation, as the logical upper page and logical lower page are both part of the same physical page.

The embodiment of FIG. 1 can include additional circuitry that is not illustrated so as not to obscure embodiments of the present disclosure. For example, the memory device 104 can include address circuitry to latch address signals provided over I/O connections through I/O circuitry. Address signals can be received and decoded by a row decoder and a column decoder to access the memory 110. It will be appreciated by those skilled in the art that the number of address input connections can depend on the density and architecture of the memory 110.

Figure 2A:
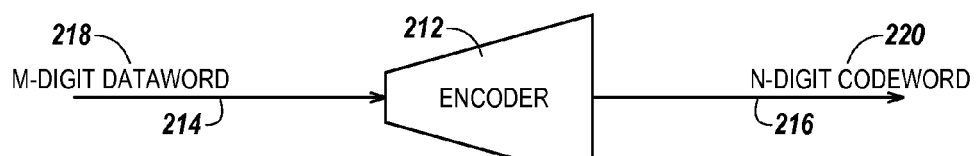
FIGS. 2A and 2B are functional block diagrams of an encoding operation in accordance with one or more embodiments of the present disclosure.
Figure 2B:
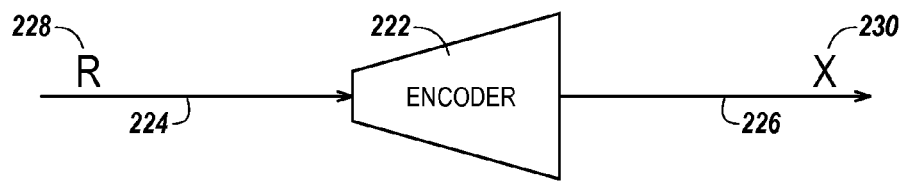

FIGS. 2A and 2B are functional block diagrams of an encoding operation in accordance with one or more embodiments of the present disclosure. It has been observed that charge storage memory cells can have a finite endurance. The quantity of program and erase cycles can affect the reliability of the data stored therein. The greater the quantity of program/ erase cycles to which a memory cell is subjected, the lower reliability of accurately determining the data that was stored by the cell. Programming a memory cell repeatedly and/or repeatedly at higher voltage levels can cause physical degradation of the memory cell resulting in reduced endurance. Memory endurance, as used herein, refers to the duration of useful life of the memory, e.g., as may be measured by time.

Some previous approaches have been directed at wear leveling in an attempt to spread out program/erase cycles more uniformly across available memory cells so as not to wear out some memory cells faster than others. According to one or more embodiments of the present disclosure, another approach to increase memory endurance is to minimize the programming/erase cycles of memory cells to begin with and/or minimize the programming of memory cells to the data states represented by relatively greater stored charges, which tend to wear out memory cells faster than data states represented by relatively lesser stored charges.

One solution to minimize such occurrences is to skew the stored data so that fewer of the memory cells used to store the data are programmed to data states that are represented by relatively greater stored charges. Programming, as used herein, refers to selectively placing a memory cell into a desired data state, and can include changing the data state of the memory cell from an erased state to a non-erased state, from a non-erased state to an erased state, and/or from one non-erased state to another non-erased state. A non-erased state is typically more detrimental to memory cell wear than an erased state. Some data states may also be more detrimental to memory cell wear than others due to how the memory cell is programmed, for example, if the memory cell is programmed with more, greater duration, and/or larger voltages (e.g., in order to program "higher" data states). Furthermore, the process of having to erase a memory cell can also contribute to memory cell wear. Different data states can be weighted differently to account for the degree of detriment associated with each particular state.

According to one or more implementations, a "0" data state is mapped to an erased state and a "1" data state is mapped to a non-erased state. However, embodiments of the present disclosure are not so limited, and can be applied to implementations where a "0" data state is mapped to a non-erased state and a "1" data state is mapped to an erased state.

One having ordinary skill in the art will recognize that, in other embodiments of the present disclosure, the erased state may be more detrimental to memory cell wear than a non-erased state. For example, the methods described herein can also be applied to minimize, or weight, erased states, rather than non-erased states, to reflect a preference for storing erased states instead of non-erased state.

Typically, an erased state can be mapped to a range of threshold voltages nominally represented by a reference voltage level (e.g., ground voltage level, approximately 0 volts, etc.) stored in a memory cell. For example, an erased state may refer to a memory cell devoid of charge. An erased state can also be mapped to a range of threshold voltages nominally represented by a non-reference voltage level such as a negative voltage level, e.g., −2 volts, or a positive voltage less than that of non-erased states. A non-erased data state can be mapped to a range of threshold voltages nominally represented by a non-reference voltage level (e.g., a voltage level other than ground, such as 1 volt, etc.) stored in an SLC memory cell.

A particular non-erased state can be mapped to one of several different threshold voltage ranges nominally represented by different non-reference level voltage levels stored in an MLC memory cell. In at least one embodiment, a non-erased state can be mapped to a relatively greater nominal voltage level (e.g., +1 volt) than the nominal voltage of an erased cell.

With respect to the discussion that follows, the apparatuses and methods of the present disclosure will be primarily illustrated based on an example implementation involving an SLC having only two data states, a "0" data state and a "1" data state where a "0" data state is mapped to an erased state corresponding to no charge (i.e., approximately zero volts) being stored in a memory cell, and a "1" data state is mapped to a non-erased state corresponding to charge (i.e., approximately 1 volt) being stored in the memory cell.

Furthermore, the "0" data state (i.e. no charge state) is assumed to be less detrimental to memory cell wear than the "1" data state (i.e. stored charge state) in the foregoing embodiments. As such, it is preferable to store data in memory cells in such an embodiment using the "0" data state, and less preferable to store data in the memory device using the "1" data state. However, embodiments of the present disclosure are not so limited, and it will be appreciated that the apparatuses and methods of the present disclosure can be adapted to a different mapping of data states to physical conditions of a memory cell by seeking to lessen the use of data states that are more detrimental to wear of the memory cell.

Data to be stored in a memory device cannot be expected to respect the above-mentioned preference for using "0" data states rather than "1" data states. That is, with binary, uniformly distributed random data, the probability of a particular digit of the data being a logical "0" is fifty percent, and the probability of the particular digit of data being a logical "1" is also fifty percent. That is, there is an equal chance that the particular digit of data is either a logical "0" or a logical "1."

According to one or more embodiments of the present disclosure, the data to be stored can be encoded such that the data is constrained to have a quantity of digits (e.g., bits) represented by a first data state (e.g., a "0" data state in this example) that is greater than or equal to a quantity of digits (e.g., bits) represented by a second data state (e.g., a "1" data state in this example), where the second data state is more detrimental to wear than the first data state (as used herein, "first" and "second" are only used to distinguish one data state from another, and should not be read to imply any particular order or number of data states). In this manner, fewer memory cells will be programmed to the "1" data state than would have been programmed to the "1" data state if the data were stored directly (e.g., un-encoded) into the memory device. Since the "1" data state is, in this example, expected to be more detrimental to the wear of a memory cell, the storing of encoded data having a quantity of "0" bits that is greater than or equal to a quantity of "1" bits should result in less wear of the memory device, in aggregate, and therefore should increase endurance of the memory device.

According to various embodiments, input data can be mapped to encoded data for storing in the memory device using a code that skews the data toward more 0's in the encoded data that will cause less programming to more detrimental data states than the unencoded input data. It should be noted that while the example used herein to illustrate the apparatuses and methods of the present disclosure prefers 0's in the encoded data rather than 1's since 0's are less detrimental under the assumptions set forth above for the example, the apparatuses and methods of the present disclosure can be applied to other mapping scenarios where 1's might be less detrimental to the memory cells (e.g., a "0" data state being mapped to a non-erased state corresponding to a nominal positive voltage stored in the memory cell and a "1" data state being mapped to an erased state corresponding to a zero or negative nominal threshold voltage stored in the memory cell). For implementations where 1's are less detrimental to the memory cells than 0's, the encoding can be structured to map input data to encoded data for storing in the memory device using a code that skews the data toward more 1's in the encoded data, which should cause less programming to detrimental data states than if the input data was stored directly.

Returning to the present example where 0's are assumed to be less detrimental to the memory cells than 1's in an SLC memory cell, and given a random input data (e.g., raw user data), a technique is presented that skews the distribution of 0's relative to 1's in the coded data to be stored in the memory device representing the input data. When the techniques of the present disclosure are applied to random input data that is uniformly distributed among possible data states can result in less wear to memory since fewer memory cells are expected to be programmed to more detrimental data states than for storing the input data directly. This technique employs the principle of enumerative coding.

The encoding and decoding of the input data to/from the encoded data to be stored can be accomplished in hardware and/or software, in the memory device and/or at a host before communication to the memory device. For example, a circuit can be used that does not rely on altering the memory cell and/or array design.

FIG. 2A shows an encoder 212 having an input 214 and an output 216. The encoder 212 can be implemented in hardware and/or software, in the memory device and/or at a host. The encoder 212 can receive, e.g., from a host, m digits of data, shown and referred to otherwise herein as an m-digit dataword 218, which can be m bits of data at the input 214 and generate n digits of data, shown and otherwise referred to herein as an n-digit codeword 220 at the output 216. As used herein, a "digit" refers to a digit of data, such as a binary digit ("bit"), a hexadecimal digit, representative members of which can be represented by a corresponding signal level or corresponding range of signal levels.

As used herein, a "dataword" refers to a combination of digits of data, such as input data, e.g., raw user data. A "codeword" refers to a combination of digits of data encoding the dataword, such as by an index mapped to the dataword. The n-digit codeword 220 can uniquely correspond to the m-digit dataword 218, and therefore can be stored in a memory device in place of the m-digit dataword 218. Since the n-digit codeword 220 can be selected to have fewer digits that would require memory cells to be programmed to more detrimental data states than the original m-digit dataword 218, the memory device should incur less wear over time, thereby increasing endurance.

FIG. 2B shows an encoder 222 having an input 224 and an output 226. Encoder 222 can be implemented in hardware and/or software, in the memory device and/or at a host. The encoder 222 can receive an integer 228, R, at the input 224 and generate an index integer 230, X, at the output 226, which can be stored in a memory device in place of R. Integer 228, R, can be the decimal value of an m-digit dataword and X can be the decimal value of an n-digit codeword uniquely corresponding to the input integer, R.

Figure 3A:
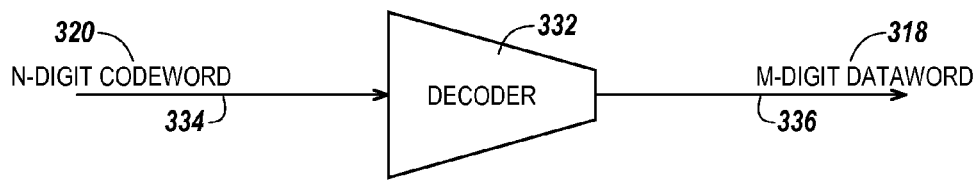
FIGS. 3A and 3B are functional block diagrams of a decoding operation in accordance with one or more embodiments of the present disclosure.
Figure 3B:
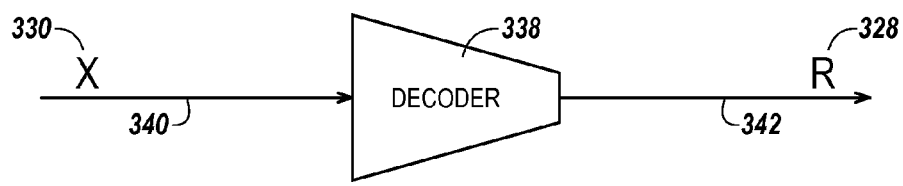

FIGS. 3A and 3B are functional block diagrams of a decoding operation in accordance with one or more embodiments of the present disclosure. FIG. 3A shows a decoder 332 having an input 334 and an output 336. The decoder 332 can be implemented in hardware and/or software, in the memory device and/or at a host. The decoder 332 can receive an n-digit codeword 320 at the input 334 and generate an m-digit dataword at the output 336. The n-digit codeword 320 can uniquely corresponding to the m-digit dataword 318. The n-digit codeword 320 can be retrieved from a memory device, decoded to generate the m-digit dataword 318, which can be returned, e.g., to a host, as the result of a memory access.

FIG. 3B shows a decoder 338 having an input 340 and an output 342. Decoder 338 can be implemented in hardware and/or software, in the memory device and/or at a host. The decoder 338 can receive an index integer 330, X, at the input 340 and generate an integer 328, R, at the output 342, where R can be the value of an m-digit dataword. X can be the value of an n-digit codeword uniquely corresponding to the m-digit dataword. Index integer 330, X, can be retrieved from a memory device, decoded to generate integer 328, R, which can be returned as the result of the memory access.

FIG. 4 illustrates mapping 3 bits of data to a 4-bit index in accordance with one or more embodiments of the present disclosure. According to one or more embodiments of the present disclosure, the quantity n is greater than the quantity m. For example, in a binary environment, the n-digit codeword actually stored in the memory device has more bits than the input m-digit dataword. However, embodiments of the present disclosure are not limited to any particular value for m and/or n. That is, m may be greater than or less than the values used in the example illustrated in this disclosure. For example, m may be 16 (or some other non-zero, positive integer quantity) and n may be 17 (or some other non-zero, positive integer quantity greater than m).

It may initially seem counterintuitive to store more bits as a way to increase endurance over that achieved by storing fewer bits. However, the mapping examples in FIGS. 4 and 5 will illustrate examples of the efficiency achievable by the apparatuses and methods of the present disclosure. FIG. 4 shows a first table (on the left) including the possible bit combinations for 3 bits of input data (e.g., the m-bit dataword), and a second table (on the right) including the possible combinations for 4 bits of encoded data (e.g., n-bit codeword). The possible 3-bit combinations 446 are shown in one column of the first table, and the integer 444 corresponding to each 3-bit combination is shown in another column of the first table. The possible 4-bit combinations 448 are shown in one column of the second table, and the integer 452 corresponding to each 4-bit combination is shown in another column of the second table. In addition, the second table includes an indication 450 of whether each 4-bit combination includes a quantity of 0's that is greater than or equal to the quantity of 1's, "Y" for yes, the combination includes at least as many 0's as 1's, and "N" for no, the combination does not include at least as many 0's as 1's.

Lines, e.g., 454, 456, drawn between row entries of the first and second tables indicate an example mapping therebetween that allows fewer "1" data states to be involved in storing the encoded 4 bits of data (e.g., n-bit codeword) than would be involved in storing the input 3 bits of input data directly (i.e., unencoded). For example, the 3-bit combination of "000" can correspond to the 4-bit combination of "0000" as indicated at 454. While one additional memory cell is required for the 4-bit combination to be actually stored in an SLC memory device corresponding to the input 3-bit combination, it will be appreciated that no additional memory cells are programmed to the more detrimental data state (e.g., a "1" data state for this example) than if the input 3 bits of data were directly stored in the memory device.

The same result occurs for each of the first seven bit combinations. That is, for each of the first seven illustrated bit combinations the 3-bit combination gets mapped to a 4-bit combination having a most significant "0" bit. In each of those cases, the 4-bit combination has a quantity of 0's that is greater than or equal to the quantity of 1's. In each such case, while the most significant "0" bit uses an additional portion of available SLC memory, the additional bit should not cause additional wear to the memory since an additional memory cell is not programmed to a data state that is expected to be more detrimental. That is, in the case of a SLC memory device, the memory cell in which the additional less detrimental bit is stored is not necessarily subjected to a same wear caused by a program/erase cycle than a memory cell in which a more detrimental bit is stored.

The last of the input 3-bit combinations (i.e., "111") is shown in FIG. 4 being mapped to the next available 4-bit combination that has a quantity of 0's that is greater than or equal to the quantity of 1's, as indicated at 456. In this example the 3-bit combination of "111" is mapped to the 4-bit combination of "1000." It should be appreciated that while actually storing the 4-bit combination of "1000" uses an additional bit of available memory space, in an SLC device, only one memory cell is programmed to a data state that is expected to be more detrimental to wear. If the input 3-bit combination of "111" were actually stored in SLC memory, then 3 memory cells would be programmed to the more detrimental data state, thus causing more wear to the two additional memory cells programmed to the more detrimental data state.

It should be appreciated that the eight 3-bit combinations shown in the left table of FIG. 4 involves a total of 24 bits (i.e., 8×3=24), and of the 24 bits, half of the bits (i.e., 12) are 0's and half of the bits (i.e., 12) are 1's. Since raw input data can be modeled as uniformly distributed random data, and each of the eight 3-bit combinations are equally likely to occur in such random data, it is expected that storing the unencoded input data in SLC memory would result in 50% of the memory cells being programmed to the more detrimental data state, on average. However, by storing an n-digit codeword corresponding to each m-digit dataword instead, it would be expected that less than half of the memory cells would be programmed to the more detrimental data state.

In the example illustrated, if a SLC memory stored one instance of each of the encoded 4-bit combinations that are mapped to the 8 possible 3-bit combinations of the input data only 10 memory cells would be programmed to the more detrimental data state to store encoded data corresponding all of the eight 3-bit combinations. Extending that to a uniformly distributed random data, it can be expected that only 10/24, or 42% of the memory cells would be programmed to the more detrimental data state, on average. Therefore, the memory device should suffer less wear since fewer memory cells, on average, should be programmed to the more detrimental state to store encoded data corresponding to the input data, which can be parsed into m-digit segments, e.g., m-digit datawords, and have corresponding n-digit segments, e.g., n-digit codewords, stored therefore. That is, storing the 4-bit encodings instead of storing the 3 bits of input data should result, on average, in 16% (100%-84%) less wear of the memory cells, and thus greater memory endurance.

In retrieving the data, the stored n-digit codeword can be decoded to generate the corresponding m-digit input data. The encoding and decoding can also be done using integer computations using the integer values for each m-digit dataword and n-digit codeword.

Figure 5:
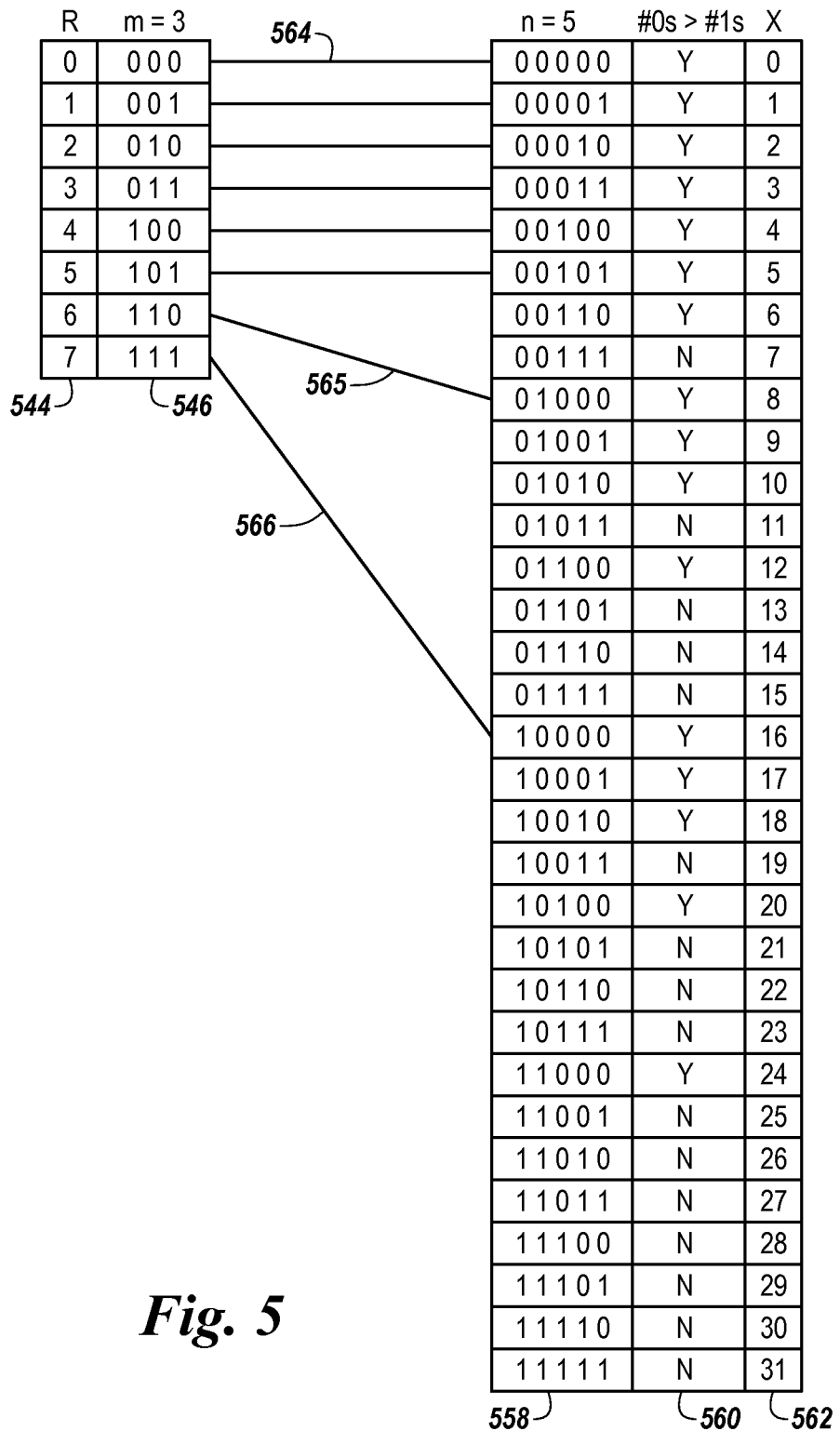
FIG. 5 illustrates mapping 3 bits of data to a 5-bit index in accordance with one or more embodiments of the present disclosure.

FIG. 5 illustrates mapping 3 bits of input data to a 5-bit combination (e.g., an index being a set of possible digit combinations to which input data can be mapped) in accordance with one or more embodiments of the present disclosure. Greater endurance can be achieved by storing combinations having even more bits. The cost is a greater usage of available memory device capacity to store the additional bits. However, additional memory cells are not programmed to the more detrimental data state so the additional use of capacity should not cause additional wear on the memory cells. In fact, wear of the memory cells should be further reduced, which further increases memory endurance.

FIG. 5 shows a first table (on the left) including the possible combinations for 3 bits of input data, and a second table (on the right) including the possible combinations for 5 bits of encoded data (e.g., n-bit codeword). The possible 3-bit combinations 546 are shown in one column of the first table, and the integer 544 corresponding to each 3-bit combinations is shown in another column of the first table. The possible 5-bit combinations 558 are shown in one column of the second table, and the integer 562 corresponding to each 5-bit combination is shown in another column of the second table. In addition, the second table includes an indication 560 of whether each 5-bit combination includes a quantity of 0's that is greater than or equal to the quantity of 1's, "Y" for yes, the combination includes at least as many 0's as 1's, and "N" for no, the combination does not include at least as many 0's as 1's.

Lines, e.g., 564, 565, 566, drawn between row entries of the first and second tables indicate a possible mapping therebetween that allows fewer "1" data states to be involved in storing the encoded 5 bits of data (e.g., n-bit codeword) than would be involved in storing the input 3 bits of input data. For example, the 3-bit combination of "000" can correspond to the 5-bit combination of "00000" as indicated at 564. While two additional memory cells are required for the 5-bit combination to actually be stored in an SLC memory device corresponding to the input 3-bit combination, it will be appreciated that no additional memory cells are programmed to the more detrimental data state (e.g., a "1" data state for this example) than if the 3 bits of input data were directly stored in the memory device.

The same result occurs for each of the first six bit combinations. That is, for each of the first six combinations the 3-bit combination gets mapped to a 5-bit combination having the two most significant bits set to "0." In each of those cases, the 5-bit combination has a quantity of 0's that is greater than or equal to the quantity of 1's. In each case, while the most significant "0" bits use an additional portion of available SLC memory, the additional bits should not cause additional wear to the memory since additional memory cells are not in a data state that is expected to be more detrimental. That is, in the case of an SLC memory, the memory cells in which the additional bits are stored are not necessarily subjected to a program/erase cycle. Each of the 3-bit combinations is mapped to a 5-bit combination having more 0's than 1's.

The mapping of the last two entries in the left table could be mapped to combination in the right table in a similar fashion to that described with respect to FIG. 4, but with an additional leading "0" bit. However, no further efficiency is gained in exchange for the cost of using a combination having an additional bit. If further endurance is desired, the mapping scheme can be altered to take advantage of those combinations having the fewest bits represented by the more detrimental data states.

For example, and as shown in FIG. 5, the input 3-bit combination of "110" can be mapped to the 5-bit combination of "01000" and the input 3-bit combination of "111" can be mapped to the 5-bit combination of "10000," each encoded combination using only one of the more detrimental data states, thereby using only two memory cells in an SLC memory programmed to the more detrimental data state, rather than the five memory cells that would be required to store the input data directly (i.e., unencoded). Thus, the total quantity of memory cells in an SLC memory that need to be programmed to the more detrimental state to store one instance of each of the eight 5-bit combinations that correspond to each of the various 3-bit combinations is now only 9, instead of 12. That is, assuming uniformly distributed random input data, storing the 5-bit combinations instead of storing the 3-bit input data should result, on average, in 25% (100%–75%) less wear of the memory cells, and thus greater memory endurance.

Figure 6:
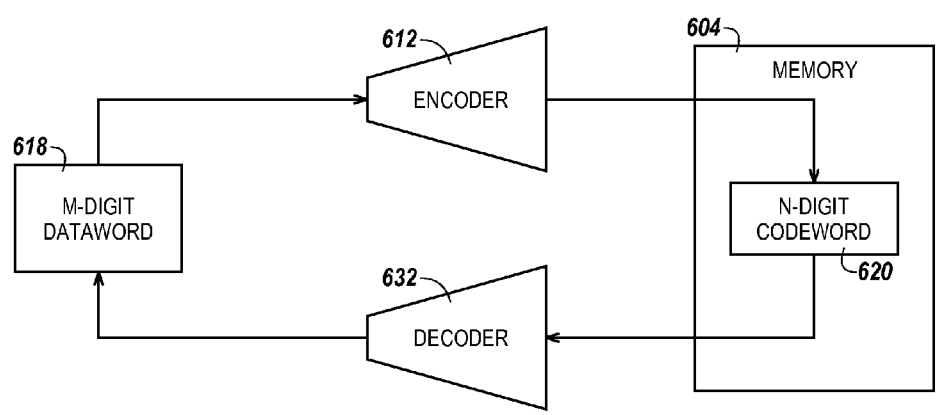
FIG. 6 is a functional block diagram of a memory endurance operation involving an apparatus in accordance with one or more embodiments of the present disclosure.

FIG. 6 is a functional block diagram of a memory endurance operation involving an apparatus in accordance with one or more embodiments of the present disclosure. According to one or more embodiments of the present disclosure, an m-digit dataword 618 (i.e., m digits of data) can be input to an encoder 612 to generate an n-digit codeword 620 (i.e., n digits of data), where n is greater than m. The n-digit codeword 620 can be communicated to, and stored in, a memory 604. That is, the larger n-digit codeword 620 is communicated and/or stored instead of the smaller m-digit dataword 618. The larger n-digit codeword 620 can subsequently be retrieved from memory 604, communicated, and input to a decoder 632 to generate the smaller original m-digit dataword 618.

As mentioned previously, more memory will be used to store the n-digit codeword 620 instead of the m-digit dataword 618. However, by constraining the mapping between the m-digit dataword 618 and the n-digit codeword 620, storing the n-digit codeword 620 can be less wearing to memory cells of the memory 604 than storing the original m-digit dataword 618, thereby reducing wear and increasing endurance.

One possible manner in which to encode and decode between an m digits of data and the corresponding n digits of data is by using enumerative coding. According to various embodiments of the present disclosure, enumerative coding can be employed for initial data expansion (i.e., a reverse of data compression), as well as initial data compression. An enumerative coding data compression strategy needs only $\log_2 |S|$ bits to represent elements of a set S, where $|S|$ is the number of elements in the set S. For example, if a set has 128 elements, the location of any of the 128 elements of set S can be represented by 7 bits since $2^7=128$. That is, various combinations of the 7 bits correspond to unique ones of the 128 elements of set S. If each element of set S is n digits of data, a compression ratio of $\log 2|S|/n$ can be achieved. In order to achieve such compression, an efficient encoding and decoding scheme is needed for the elements of set S. If the elements of set S are appropriately ordered, it is possible to devise efficient encoding and decoding schemes with respect to such an ordering.

With respect to the present disclosure, a enumerative coding data expansion technique can be utilized. A specific length n can be chosen apriori, which constrains the input length m to be less than n. According to one or more embodiments of the present disclosure, the input m digits of data is the shorter enumerative encoding quantity that corresponds to the longer n digits of data. However, according to the present disclosure, the longer n digits of data codeword can be communicated and/or stored rather than the shorter m digits of data For example, 17 can be chosen as n for use in a memory endurance technique for an SLC memory device storing binary data. The constraint can be imposed that the number of 1's (e.g., represented by a more detrimental state) in such an n-digit codeword must be between two limits $w_1$ and $w_2$. For example, the values of $w_1$ and $w_2$ can be chosen to be $w_1=0$ and $w_2=8$. However, the values of these parameters can be different than those selected for illustrative purposes here. This particular constraint will force each 17-bit codeword to have more, or at least as many, bits in a less detrimental erased state, e.g., "0," as in a more detrimental non-erased state, e.g., "1. In general, $w_1$ and $w_2$ can be arbitrarily set to satisfy the following constraints: $w_1 \geq 0$ and $w_2 \leq n$.

For this example, the set S of n-digit codewords can then be generated that satisfy the above-mentioned constraints, i.e., those 17 bit combinations having from 0 to 8 bits represented by the more detrimental data state. The size of the set of 17-bit codewords that include from 0 to 7 bits represented by the more detrimental logical 1 state can be denoted by $|S|$. Next, $\log_2 |S|$ can be computed. If $\log_2 |S|$ is a fractional number, the biggest integer less than $\log_2 |S|$ can be determined, i.e., the floor where floor(X) means the largest integer less than or equal to X. The size, m, of the input dataword can be set equal to floor($\log_2 |S|$) since for binary data it is ensured that $2^m \leq |S|$, a rate min code can be constructed.

Incoming data can be parsed into m-bit datawords for encoding. That is, any arbitrary m-bit binary dataword can be mapped to a unique one of the 17-bit codewords that are elements of set S. This makes a rate min code possible, with min being the highest rate possible with the above-mentioned constraint on the quantity of bits represented by the more detrimental data state, i.e., 1's, in the codeword.

The following discussion concerns one possible implementation of a method of operating a memory device for memory endurance, including encoding and decoding techniques to correspond between an input m-bit dataword and an n-bit codeword for a memory device utilizing SLC memory cells, with n and m being determined as described above. As an SLC application of the apparatuses and methods of the present disclosure, data is expressed in terms of individual bits, rather than, for example, sub-combinations of bits or hexadecimal digits. However, embodiments of the present disclosure are not limited to this particular technique and can be implemented according to other methodologies, computations, and/or mapping techniques.

Decoding an n-bit codeword to re-generate the original m-bit dataword, such as might occur in conjunction with the n-bit codeword being retrieved from a memory device, can be implemented as follows. Given an n-bit codeword $b_1 b_2 \ldots b_n$ in the set S of possible codewords, scanning the n-bit codeword can begin from left to right (e.g., most-significant bit to least-significant bit). For every bit $b_i$, a quantity $q_i$ can be determined as follows:

$$q_i = \sum_{p=w_1}^{w_2} b_i \binom{n}{l(p, i)}$$

Here, for each p between $w_1$ and $w_2$ inclusive, $l(p,i)=p-$(sum of the first (i–1) bits in $b_1 b_2 \ldots b_n$). All these computed $q_i$ values can then be summed to get the value, R, of the original m-bit binary dataword corresponding to codeword $b_1 b_2 \ldots b_n$ in S as follows:

$$R = \sum_{i=1}^{n} q_i.$$

Observe that the determination of $q_i$ occurs only when the $i^{th}$ bit is a 1 (i.e., $b_i=1$). When $b_i=0$, no action is needed since $q_i$ will be 0 as well. Therefore, decoding can be accomplished, for example, using two 'for' loops where all the quantities are constants and can be pre-determined and retrieved as needed. The m-bit dataword can be derived from the value R in a conventional manner.

Encoding the original m-bit dataword to generate the n-bit codeword, such as might occur in conjunction with the n-bit codeword being stored to a memory device, can be performed as follows. A variable, L, can be set to R where R is the integer equivalent of the original m-bit dataword to be encoded. Then, beginning with counter $$i = 1, \quad S_i = \sum_{p=w_1}^{w_2} l(p, i)$$

can be determined, where $l(p,i)=p-(\text{sum of the first } (i-1) \text{ bits in } b_1 b_2 \ldots b_n)$. If R is greater than $S_i$, then $b_i$ is set equal to 1. R is updated to be equal to $R-S_i$, counter i is incremented, and the iterative determination of $S_i$ continues until i exceeds n. If R is not greater than $S_i$, then $b_i$ is set equal to a "0," R is updated to be equal to $R-S_i$, i is incremented, and iterative determination of $S_i$ continues until i exceeds n.

The above discussion concerned the special case of binary data and SLC memory cells. The following discussion concerns another possible implementation of methods for memory endurance, including encoding and decoding techniques to correspond between an input m-digit dataword and an n-digit codeword, as may be applicable to a memory device utilizing MLC memory cells, for example. Embodiments of the present disclosure are not limited to this particular technique, and methods for memory endurance can be implemented according to other methodologies, computations, and/or mapping techniques.

Skewing a set of n-digit codewords, that are stored in place of m-digit datawords, to have fewer bits represented by a more detrimental data state, similar to that discussed above with respect to FIGS. 4 and 5 for binary data and SLC memory cells, by itself can alter the distribution of each of the multiple-states (e.g., four data states in {00, 01, 10, 11}, eight data states in {000, 001, 010, 011, 100, 101, 110, 111}, etc.) in the encoded data to improve the endurance of an MLC device.

In MLC storage, the data states can be written at different voltage levels, and so, are not equally detrimental. For the binary methodology example discussed previously, the more detrimental 1's data state was restricted. Restricting the 1's data state for an MLC cell can indirectly restrict the occurrences of the non-zero (e.g., less detrimental) data states such as 10, 01, and 11 for a two bit MLC, since the digit 1 can be a part of the three more detrimental states. However, a better approach is to directly affect the occurrence of the grouping of multiple bits (e.g., 11, 10, and 01 for a two bit MLC) by treating each grouping as a member of a multi-digit alphabet (e.g., {0, 1, 2, 3} for a two bit MLC), which is discussed further below. Therefore, by considering these additional data state characteristics, it is possible to implement MLC shaping codes that more explicitly control the data states for MLC programming more efficiently than those applied to improve wear endurance of SLC memory cells.

Enumerative coding involves an element in an ordered set S being encoded as a reference to a location (e.g., index) in the ordered set S. While different orderings are possible, lexicographic ordering allows development of efficient encoding and decoding algorithms for members of S. Given that the "alphabet" for each alpha-numeric digit consists of M possible data states {1, 2, ..., M}, each represented by a respective one of the M data states, and given that a codeword is n-digits long, encoding and decoding algorithms can be developed that impose a pre-defined weight-distribution {w1, w2, ..., $w_M$} for the alphabet in each codeword. In other words, $w_1+w_2+\ldots+w_M=n$. The size of such a set |S| can be computed using the multinomial formula:

$$|S| = \binom{n}{w_1, w_2, \ldots, w_M}$$

The formula can be expressed as a product of binomials as follows:

$$|S| = \binom{w_1}{w_1}\binom{w_1 + w_2}{w_2}\ldots\binom{w_1 + w_2 + \ldots + w_M}{w_M}$$

Given the M data states, i.e., M=2 data states {1, 2} in SLC, M=4 data states {1, 2, 3, 4} in a two bits-per-cell MLC, M=8 data states {1, 2, 3, ..., 8} in three bits-per-cell MLC, or simply M=M data states {1, 2, ..., M} in an M-data state per cell case, where each level is treated as a member of an alphabet of size M. Consider a set S of n-digit codewords in which the weight distribution {$w_1$, $w_2$, ..., $w_M$} is imposed on each codeword. The size of the set, |S|, can be determined. By letting m=floor($\log_2$|S|), any m-digit dataword represents the location of an n-digit codeword in S. This allows a rate min code, where the code-rate is expressed as bits-per-level. The code-rate can be expressed in bits-per-bits by determining $$R = \frac{m}{n * \lceil \log_2 M \rceil}.$$

The whole list S need not be built or maintained (e.g., in the memory device). That is, the m-digit dataword and corresponding n-digit codeword can be determined computationally to avoid using memory space for storing the set S. However, embodiments of the present disclosure are not so limited, and can be implemented with a stored table containing those n-digit codewords that satisfy the desired constraints as elements of S and the m-digit dataword. An m-digit dataword can be directly mapped to an n-digit codeword, by mapping or rule, and vice versa directly. However, the mapping relies on the implicit knowledge that the n-digit codeword is situated in an ordered list.

Continuing with the multi-state methodology, in the n-digit codeword, each digit can be replaced by its corresponding binary tuple to generate the binary sequence. Certain advantages can be realized in looking at the alphabet as {1, 2, ..., M}, including there being no requirement that the members of the alphabet, when converted to binary form, need to conform to lexicographic ordering. This allows for Gray-code ordering of the data states, or any other ordering for that matter. Another advantage can be that M need not be a power of 2, which allows for coding in cases such as 3.8 bits-per-cell etc.

The n-digit codeword is a string x of n digits in a lexicographically ordered list. The n-digit codeword can be derived by determining $$I = \sum_{j=1}^{n} \sum_{m=1}^{x_{j}-1} n_s(x_1, x_2, \ldots, x_{j-1}, m),$$

where I is the integer value of the n-digit codeword, and $n_S$ ($x_1, x_2, \ldots, x_{j-1}$, m) is the number of n-digit codewords that begin with $x_1, x_2, \ldots, x_{j-1}$, m. The index j is the current digit position that is being examined as the codeword is scanned from left to right. That is, if the codeword is represented by $x_1$ $x_2$ $x_3$ ... $x_m$, and if digit $x_6$ is currently being examined, then j=6.

Since the alphabet has M digits in it, $x_3$ could be any one of those M letters from the alphabet {1, 2, 3, . . . , M}. The quantity M is distinguished from the variable m. The quantity M is the number of possibilities for each position (e.g., the number of digits in the alphabet). For example, for $x_j$=6, count all the words that begin with $x_1$ $x_2$ $x_3$ ... $x_{j-1}$ 1, all the words that begin with $x_1$ $x_2$ $x_3$ ... $x_{j-1}$ 2, all the words that begin with $x_1$ $x_2$ $x_3$ ... $x_{j-1}$ 3, all the words that begin with $x_1$ $x_2$ $x_3$ ... $x_{j-1}$ 4, all the words that begin with $x_1$ $x_2$ $x_3$ ... $x_{j-1}$ 5. All those words will precede words that begin with $x_1$ $x_2$ $x_3$ ... $x_{j-1}$ 6. This reflects is how words are arranged in a dictionary, for example.

Therefore, the location of a word that begins with $x_1$ $x_2$ $x_3$ ... $x_{j-1}$ 6 will exceed the total count of words that begin with $x_1$ $x_2$ $x_3$ ... $x_{j-1}$ 1, words that begin with $x_1$ $x_2$ $x_3$ ... $x_{j-1}$ 2, words that begin with $x_1$ $x_2$ $x_3$ ... $x_{j-1}$ 3, . . . , words that begin with $x_1$ $x_2$ $x_3$ ... $x_{j-1}$ 4, words that begin with $x_1$ $x_2$ $x_3$ ... $x_{j-1}$ 5 since all these words would appear earlier in the list. This is what that inner summation is doing in the formula above. In the particular example of $x_j$=6, it is why the summation goes up to $x_j$−=5 beginning with 1. These summations are computed as the codeword is scanned from position number 1, i.e., j=1, all the way to the last position in the codeword, i.e., j=m.

With respect to the MLC coding method, to encode an integer i, for k=1: n, find a letter m that belongs to the alphabet {1, 2, 3, . . . , M} such that if i>$n_S$ ($x_1, x_2, \ldots, x_{k-1}$, m−1) and i≤$n_S$($x_1, x_2, \ldots, x_{k-1}$, m), $x_k$ is set equal to m. Counter i can be adjusted to equal i−nS($x_1, x_2, \ldots, x_{k-1}$, m−1) and the determination iteratively determined, e.g., as a "for loop." This will output a string of n data states $x_1$ $x_2$ ... $x_n$. Finally, each level can be replaced with its corresponding binary tuple to get a binary string.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
    encoding m digits of data into n digits of data, n being greater than m, the m digits of data having a first quantity of digits represented by a first data state that is more detrimental to memory cell wear than a second data state; and
    storing the n digits of data in an apparatus having memory cells.

2. The method of claim 1, wherein the n digits of data include at most the first quantity of digits represented by the first data state.

3. The method of claim 1, wherein the n digits of data include less than the first quantity of digits represented by the first data state.

4. The method of claim 1, further comprising receiving the m digits of data at the apparatus, wherein encoding occurs at the apparatus.

5. The method of claim 1, further comprising receiving the n digits of data at the apparatus, wherein encoding occurs at a host.

6. The method of claim 1, further comprising
    retrieving the n digits of data from the apparatus; and
    decoding the n digits of data into the m digits of data.

7. The method of claim 6, further comprising communicating the n digits of data between the apparatus and a host, wherein decoding occurs at the host.

8. The method of claim 6, further comprising communicating the m digits of data between the apparatus and a host, wherein encoding occurs at the apparatus.

9. A method, comprising:
    encoding, by an encoder implemented in hardware, m digits of data into n digits of data, n being greater than m, the m digits of data having a first quantity of digits represented by a first data state that is more detrimental to wear of memory cells of a memory device than a second data state,
    wherein the n digits of data include at most the first quantity of digits represented by the first data state.

10. The method of claim 9, wherein the n digits of data include less than the first quantity of digits represented by the first data state.

11. The method of claim 9, further comprising communicating the m digits of data between the memory device and a host.

12. The method of claim 9, further comprising communicating the n digits of data between the memory device and a host.

13. A system, comprising:
    memory cells; and
    an apparatus communicatively coupled to the memory cells and configured to:
        encode m digits of data into n digits of data, the m digits of data having a first quantity of digits represented by a first data state that is more detrimental to wear of the memory cells than a second data state,
    wherein the n digits of data include at most the first quantity of digits represented by the first data state.

14. The system of claim 13, wherein the n digits of data include at most the first quantity of digits represented by the first data state.

15. The system of claim 13, wherein the apparatus is configured to store the n digits of data in the memory cells.

16. The system of claim 13, wherein the n digits of data include less than the first quantity of digits represented by the first data state.

17. The system of claim 13, wherein the apparatus is a host, the system further comprising a controller communicatively coupled between the host and the memory cells and configured to:
   receive the n digits of data communicated from the host; and
   store the n digits of data in the memory cells.

18. The system of claim 17, wherein the controller is configured to:
   retrieve the n digits of data from the memory cells; and
   communicate the n digits of data to the host, and
   wherein the host is configured to decode the n digits of data into the m digits of data.

19. The system of claim 13, wherein the apparatus is a controller configured to:
   receive the m digits of data communicated from a host;
   store the n digits of data in the memory cells;
   retrieve the n digits of data from the memory cells;
   decode the n digits of data into the m digits of data; and
   communicate the m digits of data to the host.

20. The system of claim 13, wherein the n digits of data are elements of a set S, m is less than or equal to floor($\log_2 |S|$), and each m digits of data are associated with a unique n digits of data of the set S.

\* \* \* \* \*